(12) United States Patent
Browning

(10) Patent No.: US 9,209,792 B1
(45) Date of Patent: Dec. 8, 2015

(54) CLOCK SELECTION SYSTEM AND METHOD

(75) Inventor: Gary A. Browning, Half Moon Bay, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 277 days.

(21) Appl. No.: 11/893,500

(22) Filed: Aug. 15, 2007

(51) Int. Cl.
| | |
|---|---|
| H03K 17/00 | (2006.01) |
| G06F 1/08 | (2006.01) |
| G06F 1/04 | (2006.01) |
| H03K 19/173 | (2006.01) |
| H03K 19/00 | (2006.01) |
| H03K 5/15 | (2006.01) |
| H03K 5/135 | (2006.01) |

(52) U.S. Cl.
CPC ............... *H03K 17/00* (2013.01); *H03K 5/135* (2013.01); *H03K 5/15033* (2013.01); *H03K 19/0013* (2013.01); *H03K 19/1737* (2013.01)

(58) Field of Classification Search
CPC .............. H03K 5/135; H03K 5/15033; H03K 19/1737; H03K 19/0013; H03K 19/00346; H03K 19/1774; H03K 17/00; G06F 1/04; G06F 1/08
USPC ................................................ 326/93, 95–98
See application file for complete search history.

(56) References Cited

U.S. PATENT DOCUMENTS

| | | |
|---|---|---|
| 4,868,832 A | 9/1989 | Marrington et al. |
| 5,220,660 A | 6/1993 | Yoshizawa et al. |
| 5,331,346 A | 7/1994 | Shields et al. |
| 5,339,445 A | 8/1994 | Gasztonyi |
| 5,365,468 A | 11/1994 | Kakubo et al. |
| 5,510,740 A | 4/1996 | Farrell et al. |
| 5,530,845 A | 6/1996 | Hiatt et al. |
| 5,586,308 A | 12/1996 | Hawkins et al. |
| 5,652,885 A | 7/1997 | Reed et al. |
| 5,737,613 A | 4/1998 | Mensch, Jr. |
| 5,758,133 A | 5/1998 | Evoy |
| 5,811,987 A * | 9/1998 | Ashmore et al. ................ 326/39 |
| 5,862,368 A | 1/1999 | Miller et al. |
| 6,057,789 A | 5/2000 | Lin |
| 6,061,410 A | 5/2000 | Linz |
| 6,118,462 A | 9/2000 | Margulis |
| 6,134,167 A | 10/2000 | Atkinson |
| 6,141,737 A | 10/2000 | Krantz et al. |
| 6,163,583 A | 12/2000 | Lin et al. |
| 6,216,234 B1 | 4/2001 | Sager et al. |
| 6,226,661 B1 | 5/2001 | Savell |
| 6,252,919 B1 | 6/2001 | Lin |
| 6,272,649 B1 | 8/2001 | Hayward et al. |
| 6,275,919 B1 | 8/2001 | Johnson |
| 6,397,340 B2 | 5/2002 | Watts, Jr. et al. |

(Continued)

OTHER PUBLICATIONS

Office Action dated Sep. 17, 2010, U.S. Appl. No. 12/002,565.

(Continued)

*Primary Examiner* — Daniel D Chang

(57) ABSTRACT

The present invention systems and methods enable configuration of functional components in integrated circuits. In one embodiment clock signal selection system includes an arbitration component, a control component, and a selection component The arbitration component coordinates arbitration eligibility between a plurality of clock signals. The control component controls the coordination utilizing a clock signal from the plurality of clock signals. The selection component selects between the plurality of signals.

20 Claims, 7 Drawing Sheets

(56) References Cited

U.S. PATENT DOCUMENTS

| | | | |
|---|---|---|---|
| 6,539,120 B1 | 3/2003 | Sita et al. | |
| 6,549,240 B1 | 4/2003 | Reitmeier | |
| 6,600,345 B1 * | 7/2003 | Boutaud | 327/99 |
| 6,600,575 B1 | 7/2003 | Kohara | |
| 6,678,831 B1 | 1/2004 | Mustafa et al. | |
| 6,690,219 B2 * | 2/2004 | Chuang | 327/176 |
| 6,690,836 B2 | 2/2004 | Natarajan et al. | |
| 6,728,959 B1 | 4/2004 | Merkey | |
| 6,747,581 B2 | 6/2004 | Hodges | |
| 6,748,408 B1 * | 6/2004 | Bredin et al. | 708/271 |
| 6,754,837 B1 | 6/2004 | Helms | |
| 6,775,776 B1 | 8/2004 | Vogt et al. | |
| 6,804,267 B1 | 10/2004 | Long et al. | |
| 6,816,809 B2 | 11/2004 | Circenis | |
| 6,845,456 B1 | 1/2005 | Menezes et al. | |
| 6,965,974 B1 | 11/2005 | Bays et al. | |
| 6,990,594 B2 | 1/2006 | Kim | |
| 7,043,649 B2 | 5/2006 | Terrell, II | |
| 7,061,409 B1 | 6/2006 | Jantti et al. | |
| 7,100,013 B1 | 8/2006 | de Waal | |
| 7,106,224 B2 | 9/2006 | Knapp et al. | |
| 7,277,101 B2 | 10/2007 | Zeng | |
| 7,414,550 B1 | 8/2008 | Sudharsanan | |
| 7,471,120 B2 * | 12/2008 | Lou | 327/99 |
| 7,590,815 B1 | 9/2009 | de Waal | |
| 7,839,410 B1 | 11/2010 | Brown et al. | |
| 8,013,637 B2 * | 9/2011 | Shikata | 327/99 |
| 8,327,173 B2 | 12/2012 | Hendin et al. | |
| 2001/0044909 A1 | 11/2001 | Oh et al. | |
| 2002/0013918 A1 | 1/2002 | Swoboda et al. | |
| 2002/0145613 A1 | 10/2002 | MacInnis et al. | |
| 2003/0025689 A1 | 2/2003 | Kim | |
| 2003/0156639 A1 | 8/2003 | Liang | |
| 2005/0021656 A1 | 1/2005 | Callegari | |
| 2005/0057551 A1 | 3/2005 | Gong et al. | |
| 2005/0125705 A1 | 6/2005 | Cheng et al. | |
| 2005/0216643 A1 | 9/2005 | Munguia | |
| 2005/0271361 A1 | 12/2005 | Aoki et al. | |
| 2007/0240013 A1 | 10/2007 | Hayashi et al. | |
| 2007/0257710 A1 * | 11/2007 | Mari et al. | 327/99 |
| 2008/0046774 A1 | 2/2008 | Hirai et al. | |
| 2009/0204830 A1 | 8/2009 | Frid et al. | |
| 2012/0188233 A1 | 7/2012 | Shuster et al. | |
| 2012/0223940 A1 | 9/2012 | Dunstan et al. | |
| 2012/0306877 A1 | 12/2012 | Rosasco | |
| 2013/0002838 A1 | 1/2013 | Takenaka | |
| 2013/0097443 A1 | 4/2013 | Li et al. | |

OTHER PUBLICATIONS

Final Office Action Dated Feb. 17, 2011; U.S. Appl. No. 12/002,565.

Non-Final Office Action; U.S. Appl. No. 12/002,565; Mail Date Oct. 20, 2011.

Final Office Action; U.S. Appl. No. 12/002,565; Mail Date Mar. 16, 2012.

* cited by examiner

400

410
Receiving a plurality of clock signals and a plurality of corresponding clock selection indication signals

420
Arbitrating impact of said plurality of selection indication signals to minimize conflict in enabling an active clock signal.

430
Enabling an active clock signal from one of said plurality of clock signals to be output, wherein said enabling is controlled by a clock included in said plurality of clock

550

CLOCK SELECTION SYSTEM AND METHOD

FIELD OF THE INVENTION

The present invention relates to the field of circuit timing and clock selection.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. Electronic systems providing these advantageous results often include components and/or functions operating at different clock rates. Accuracy in the clock rates is often critical to correct and proper operation. However, changing between clock rates can be challenging and can result in a number of different adverse impacts.

There are a variety of different devices and designs in which multiple clock domains are utilized. For example, in a clock tree design the clock tree can be driven by more than one clock source. Changing active clock selection between multiple clock sources can introduce clock glitches and clock runt pulses. The clock glitches and runt pulses can adversely affect timing transitions in sequential logic that are driven by the clock signals.

SUMMARY

The present invention systems and methods enable clock selection between a plurality of different clock signals. In one embodiment, a clock signal selection system includes an arbitration component, a control component, and a selection component The arbitration component coordinates arbitration eligibility between a plurality of clock signals. The control component controls the coordination utilizing a clock signal from the plurality of clock signals. The selection component selects between the plurality of signals.

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 4 is a flow chart of an exemplary clock signal selection method in accordance with one embodiment of the present invention.

DETAILED DESCRIPTION

Figure 1:
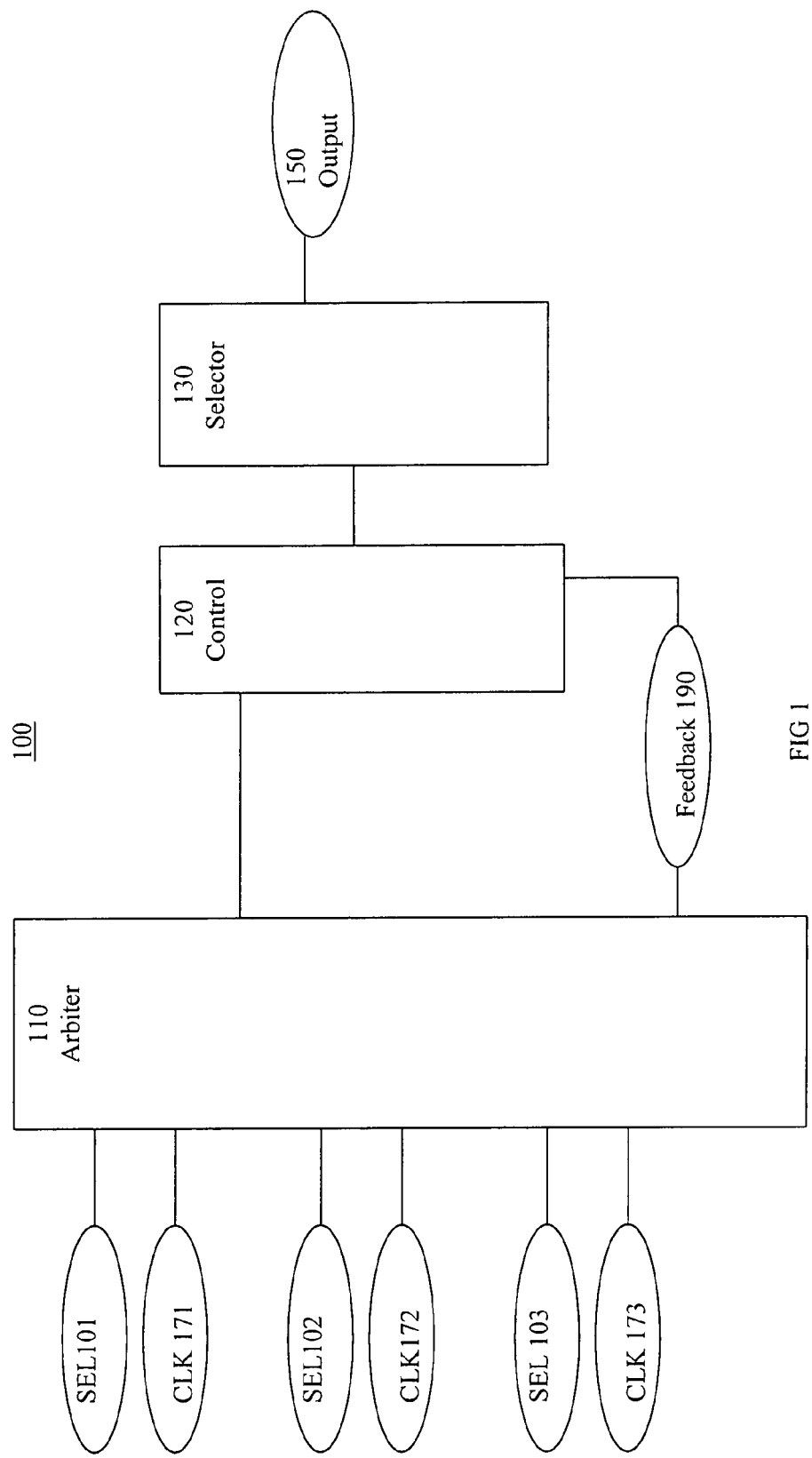
FIG. 1 is a block diagram of an exemplary clock signal selection system in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

Present invention clock signal selection systems and methods facilitate selection of an active clock signal. The active clock signal is selected from a plurality of incoming clock signals and the incoming clock signals are utilized in controlling the changing or selection of one of the plurality of clock signals as the active clock signal. In one embodiment, a one-hot multiplexer interface is utilized. A cross coupled feedback technique can be utilized to ensure a first one of the plurality of incoming clock signals is deselected before a second one of the plurality of incoming clock signals is selected as the active clock signal. In one exemplary implementation, the plurality of incoming clock signals span different clock domains.

FIG. 1 is a block diagram of exemplary clock signal selection system 100 in accordance with one embodiment of the present invention. Clock signal selection system 100 includes arbitration component 110, control component 120 and selection component 130. Arbitration component 110 is coupled to control component 120 which is coupled to selection component 130.

Figure 2A:
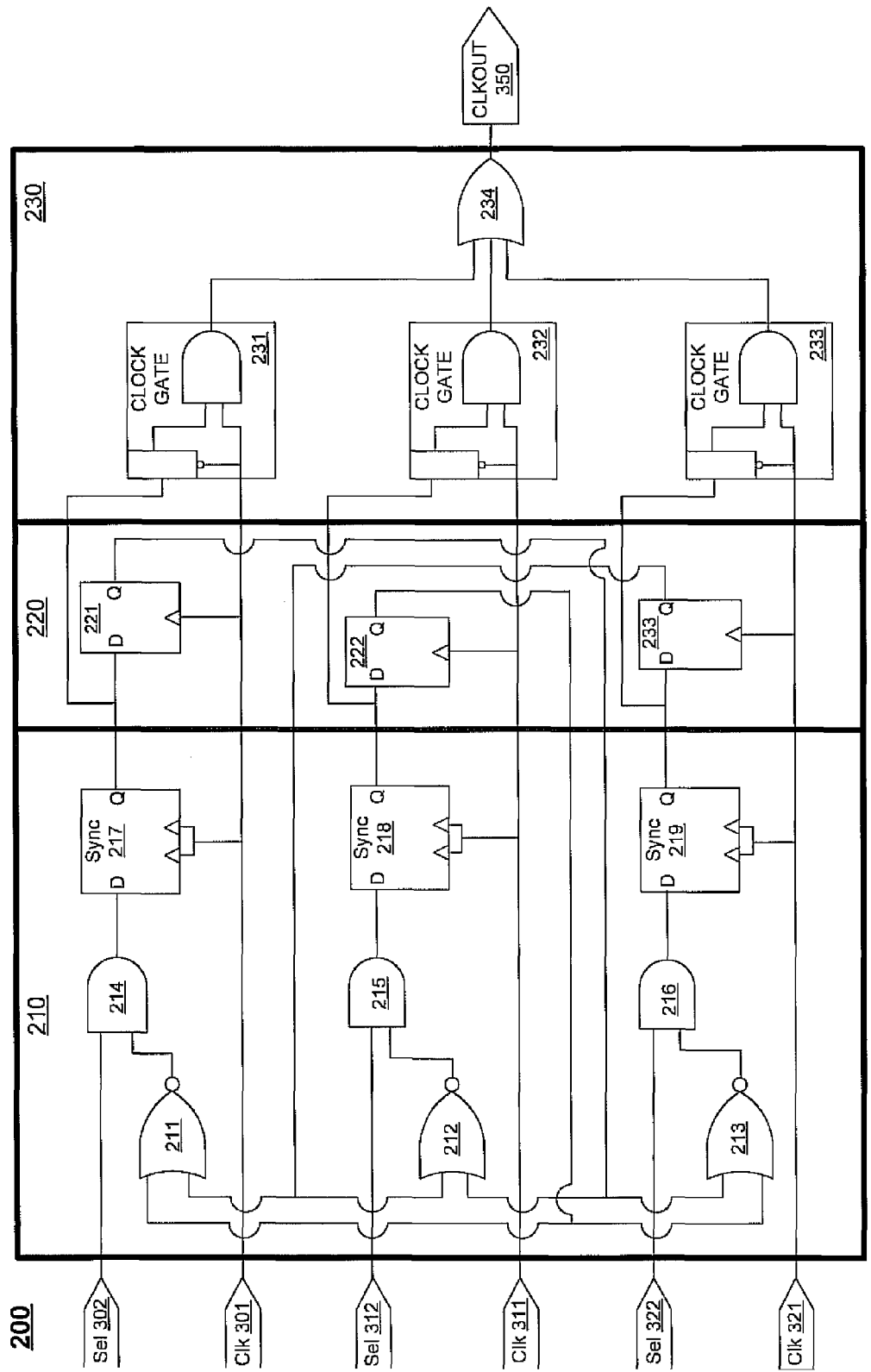
FIG. 2A is a block diagram of one exemplary clock signal selection system in accordance with one embodiment of the present invention.

The components of clock signal selection system 100 cooperatively operate to select a clock signal as a active signal without reliance on an external master clock. Arbitration component 110 coordinates arbitration eligibility between a plurality of clock signals 171, 172 and 173. Control component 120 controls the coordination utilizing a clock signal from the plurality of clock signal 171, 172 and 173. In one embodiment, a first one of the plurality of clock signals that is currently running is utilized for controlling the coordination and selection of a second one of the plurality of clock signals. Selection component 120 selects one of the plurality of signals and outputs as an active clock signal FIG. 2A is a block diagram of one exemplary clock signal selection system 200 in accordance with one embodiment of the present invention. Clock signal selection system 200 is similar to clock signal selection system 100. Clock signal selection system 200 includes arbitration component 210, control component 220 and selection component 230. The components of clock signal selection system 200 cooperatively operate to select a clock signal utilizing a cross coupled feedback control and a one hot selection mechanism to select an active output clock signal.

In one embodiment, arbitration component 210 includes NOR gates 211, 212, and 213, AND gates 214, 215, 2126, and synchronizing components 217, 218, and 219. The NOR gates 211, 212 and 213 ensure the selection of one of the plurality of clock signals does not occur while another of the plurality of clock signals is selected. The AND gates 214, 215, and 216 coordinate the selection between the plurality of signals with selection of another of the plurality of signals. Synchronizing components 217, 218 and 219 synchronizes a selected one of the plurality of clock signal, which helps avoid meta-stability in the selected output. In one embodiment, cross coupling feedback is utilized to direct the arbitration by the arbitration component.

In one embodiment, control component 220 includes a flip flop for introducing a delay to mitigate runt pulse impact. For example, mitigating in one exemplary implementation, the flip flop ensures a runt pulse does not pass the selection component OR gate between the time a first clock signal is gated off and the next active d or enabled clock being gated on. The control component also helps keep the high or low pulse of the resulting clock is no faster than either the clock that is being gated off nor the clock that is being gated on.

In one embodiment, the selection component is a multiplexer. In one exemplary implementation the multiplexer includes a clock gate and an OR gate. The clock gate coordinates timing between a selection by the selection component and control component with a selected clock signal transition to avoid glitches. In one embodiment, the clock gate includes a latch that opens for a portion of a clock cycle. The OR gate logically "ORs" clock signal output.

Figure 2B:
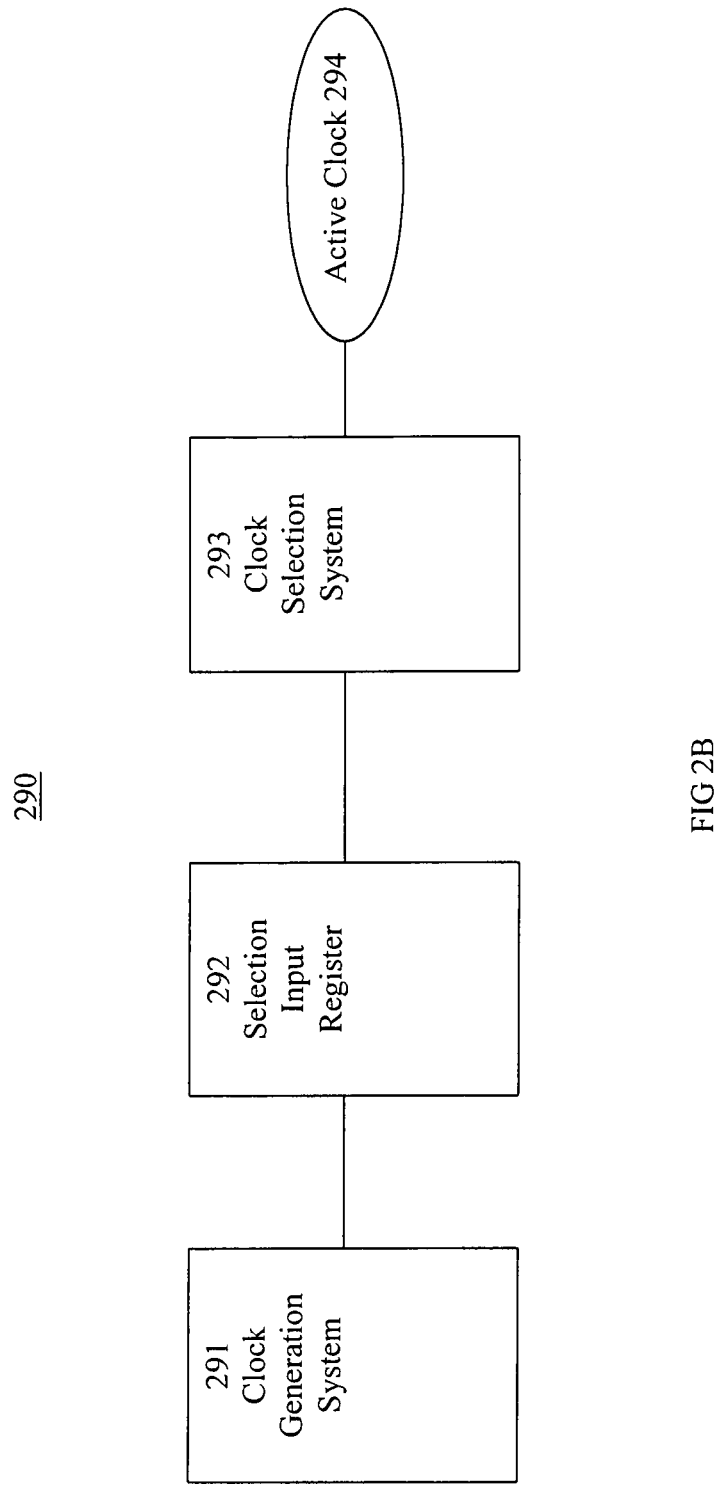
FIG. 2B is a block diagram of an exemplary clock system including a clock signal selection system in accordance with one embodiment of the present invention.

FIG. 2B is a block diagram of exemplary clock system 290 in accordance with one embodiment of the present invention. Clock system 290 includes clock generation system 291, selection input register 292, and clock selection system 293. Clock generation system 291 is coupled to selection input register 293 which in turn is coupled to clock selection system 293.

The components of clock system 290 cooperatively operate to facilitate efficient clock signal switching. Clock generation system 291 generates a plurality of clock signals. In one exemplary implementation, clock generation system 291 includes a plurality of clock generation components. Clock selection system 293 selects between the plurality of clock signals, wherein the clock selection system utilizes cross coupling feedback of clock selection indications in controlling the selection between the plurality of clock signals The clock selection system performs the selecting while minimizing introduction of clock glitches and runt pluses. Selection input register 293 forwards the clock selection indications. In one exemplary implementation, selection input register 292 receives input in accordance with software controlled instructions.

Figure 3:
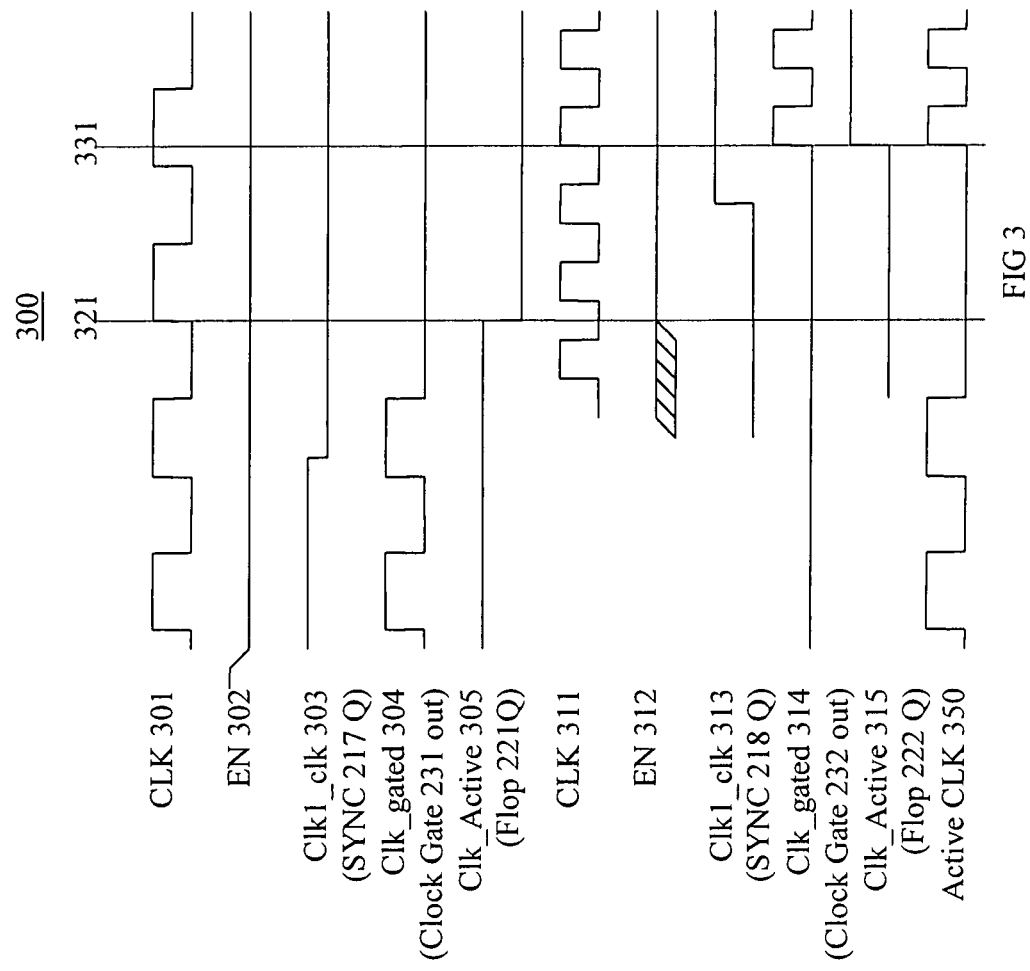
FIG. 3 is an exemplary timing diagram in accordance with one embodiment of the present invention.

FIG. 3 is an exemplary timing diagram 300 in accordance with one embodiment of the present invention. Timing diagram 300 includes exemplary timing transitions for first clock signal 301, enable signal 302, first clock enable signal 303, first clock gated signal 304, first clock active signal 305, second clock signal 311, enable signal 312, second clock enable signal 313, second clock gated signal 314, second clock active signal 315, and active clock output 350. In timing diagram 300, an active output 350 signal corresponding to the frequency of first clock signal 301 is changed to a frequency corresponding to second clock signal 311. As shown in timing diagram 300 active clock output 350 corresponds to first clock gated signal 304 up until time 321 and after the clock selection operations active clock output 350 corresponds to second clock gated signal 314 after time 331.

In one embodiment, there are 1 to 3 target clock cycles in a clock "hole" or between deactivation of a first incoming clock as the active clock (e.g., at time 321) and activation of second incoming clock as the active clock (e.g., at time 331). In one exemplary implementation, there is a latency of up to 3 target clock periods. While there may be a delay, there is not necessarily a minimum delay required between clock select changes.

In one embodiment, glitches on a decoded clock select line cause multiple clocks to be enabled when a non-active clock is currently selected. Registering the decoded "one-hot" selection signals before use avoids these glitches. The logic is skew tolerant and resulting skew does not affect the operation. In one exemplary, the skew on the clock select decode signals is less than 1 cycle of the fastest clock period to avoid increase clock "hole" time.

FIG. 4 is a flow chart of clock signal selection method 400 in accordance with one embodiment of the present invention. In one embodiment, clock signal selection method 400 facilitates dynamic selection of different clock signals without an extra external dedicated clock signal for controlling the clocking of selection operations. In one exemplary implementation, clock signal method 400 utilizes incoming clock signals to control clocking of the clock signal selection operations.

At block 410, a plurality of clock signals and a plurality of corresponding clock selection indication signals are received. The plurality of clock signals can be received from a single source or a variety of sources. In one embodiment, the clock signals operate at different frequencies and a different phase to one another.

At block 420, arbitration is performed on the plurality of selection indication signals to minimize conflict in selection of the active clock signal. In one embodiment, the enabling and arbitrating utilizes feedback from a clock signal that is already running in selecting of another new clocksignal. The arbitrating ensures an enablement of one of the plurality of clock signals does not occur while another of the plurality of clock signals is enabled.

At block 430, an active clock signal from one of the plurality of clock signals to be output is enabled. In one embodiment, the enabling is controlled by a clock included in the plurality of clock signals. In one embodiment, timing between one of the plurality of clock signals being enabled and another of the plurality of clock signals being enabled prevents a runt pulse.

In one embodiment, the enabling and arbitrating includes changing from one of the plurality of clock signals to control the enabling and arbitrating to another of the plurality of clock signals to control the enabling and arbitrating. The enabling and arbitrating are tolerant of clock skew.

Figure 5A:
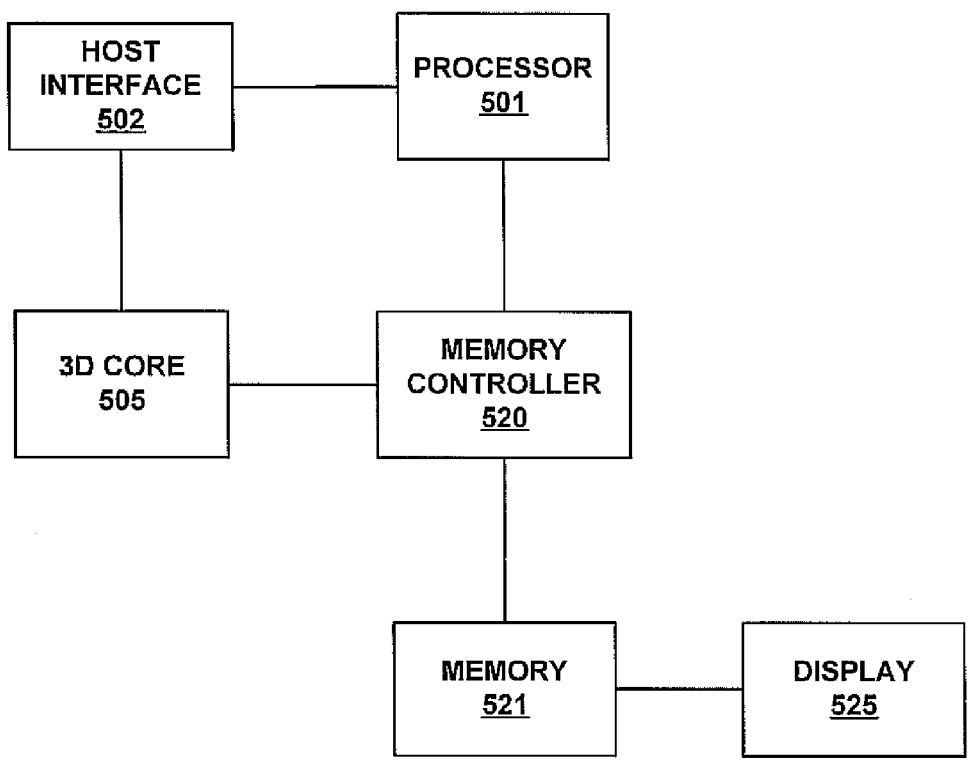
FIG. 5A is a block diagram of an exemplary computer system in which clock selection can be performed in accordance with one embodiment of the present invention

FIG. 5A is a block diagram of exemplary computer system 500 in which clock selection can be performed in accordance with one embodiment of the present invention. Computer system 500 may provide the execution platform for implementing operations or certain software-based functionality of the present invention. As depicted in FIG. 5A, the computer system 500 includes a CPU 501 coupled to a graphics processor 505 via a host interface 502. The host interface 502 translates data and commands passing between the CPU 501 and the graphics processor 505 into their respective formats. Both the CPU 501 and the graphics processor 505 are coupled to a memory 521 via a memory controller 520. In the system 500 embodiment, the memory 521 is a shared memory, which refers to the property whereby the memory 521 stores instructions and data for both the CPU 501 and the graphics processor 505. Access to the shared memory 521 is through the memory controller 520. The shared memory 521 also stores data comprising a video frame buffer which drives a coupled display 525. As described above, certain processes and steps of the present invention are realized, in one embodiment, as a series of instructions (e.g., software program) that reside within computer readable memory (e.g., memory 521, CD, etc,) of a computer system (e.g., system 500) and are executed by the CPU 501 and graphics processor 505 of system 500.

As shown in FIG. 5A, system 500 shows the basic components of a computer system platform that may implement the functionality of the present invention. Accordingly, system 500 can be implemented as, for example, a number of different types of portable handheld electronic devices. Such devices can include, for example, portable phones, PDAs, handheld gaming devices, and the like. In such embodiments, components would be included that are designed to add peripheral buses, specialized communications components, support for specialized 10 devices, and the like.

Figure 5B:
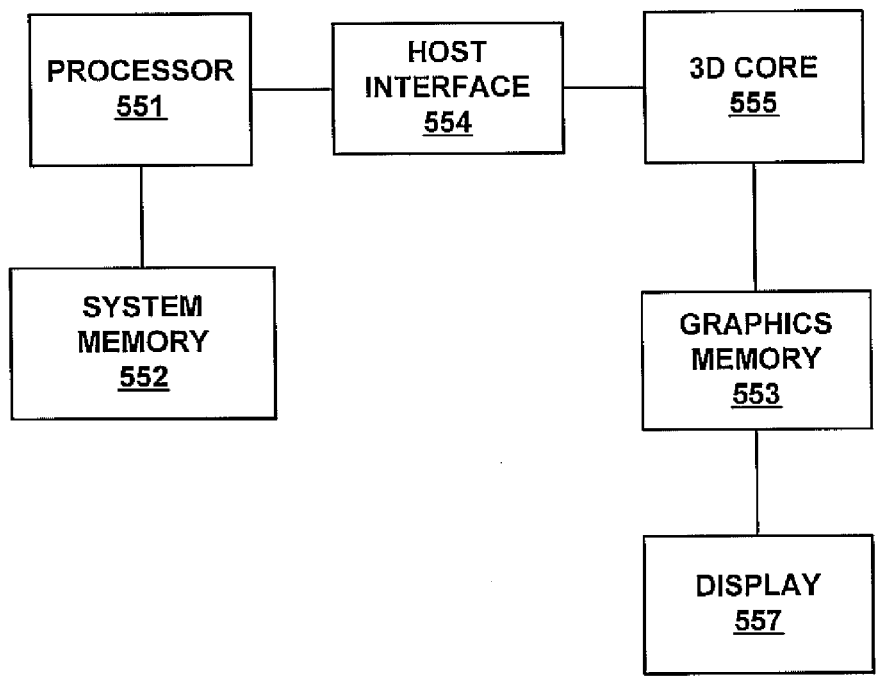
FIG. 5B shows an alternative exemplary computer system configuration in which clock selection can be performed in accordance with an alternative embodiment of the present invention.

Additionally, it should be appreciated that although the components 501-557 are depicted in FIGS. 5A and 5B as a discrete components, several of the components can be implemented as a single monolithic integrated circuit device (e.g., a single integrated circuit die) configured to take advantage of the high levels of integration provided by modern semiconductor fabrication processes. For example, in one embodiment, the CPU 501, host interface 502, graphics processor 505, and memory controller 220 are fabricated as a single integrated circuit die.

FIG. 5B shows a computer system 550 in which clock selection can be performed in accordance with one alternative embodiment of the present invention. Computer system 550 is substantially similar to computer system 500 of FIG. 5A. Computer system 550, however, utilizes the processor 551 having a dedicated system memory 552, and the graphics processor 555 having a dedicated graphics memory 553. Host interface 554 translates data and commands passing between the CPU 501 and the graphics processor 555 into their respective formats. In the system 550 embodiment, the system memory 551 stores instructions and data for processes/threads executing on the CPU 551 and graphics memory 553 stores instructions and data for those processes/threads executing on the graphics processor 555. The graphics memory 553 stores data for the video frame buffer which drives the display 557. As with computer system 500 of FIG. 5A, one or more of the components 551-553 of computer system 550 can be integrated onto a single integrated circuit die.

It is appreciated that the present invention can be implemented in a variety of embodiments. Present clock selection systems and methods can be utilized in a number of different devices. For example, the present invention can be utilized to select clocks in a game console, personal computer, personal digital assistant, cell phone, etc. In one exemplary implementation, the present invention can be utilized in systems that provide a variety of graphics applications (e.g., video games, movies, images, etc.) on any number of platforms. It is also appreciated that references to these applications or implementations are exemplary and the present invention is not limited to these examples.

Thus, the present invention enables flexible selection of an active clock signals from a plurality of incoming clock signals utilizing. Utilization of a cross coupled feedback technique allows coordination of the selection of the active clock signal without a need for special sequencing of the interface signals controlled by a separate master clock signal. The selection of the active clock signal is performed efficiently while minimizing the clock glitch and runt pulse problems when changing clock sources.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A clock signal selection system comprising:
an arbitration component for coordinating eligibility between a plurality of clock signals input to said arbitration component, wherein each one of the plurality of clock signals have a respective each one of a plurality of corresponding respective external clock selection indication signals input to said arbitration component, wherein at least two of said external clock selection indication signals are independently externally generated, wherein said arbitration component includes a one hot mechanism;
a control component for controlling the coordination utilizing a clock signal from the plurality of clock signals, wherein a first one of the plurality of clock signals that is currently running is utilized for controlling the coordination and selection of a second one of the plurality of clock signals; and a selection component for selecting between the plurality of clock signals, wherein the selection component includes a multiplexer and the multiplexer includes:

a clock gate for coordinating timing between a selection by the selection component and control component with a selected clock signal transition to avoid glitches; and an OR gate for logically ORing clock signal output.

2. The clock signal selection system of claim 1 wherein the arbitration component comprises:

a NOR gate for ensuring selection of one of the plurality of clock signals does not occur while another of the plurality of clock signals is selected; and an AND gate for coordinating the selecting between the plurality of clock signals with selection of another of the plurality of signals.

3. The clock signal selection system of claim 2 wherein the arbitration component further comprises a synchronizer for synchronizing a selected one of the plurality of clock signals to avoid meta-stability.

4. The clock signal selection system of claim 1 wherein the control component utilizes cross coupling feedback to direct the arbitration by the arbitration component.

5. The clock signal selection system of claim 1 wherein the control component includes a flip flop for introducing a delay to mitigate runt pulse impact.

6. The clock signal selection system of claim 1 wherein the clock gate comprises a latch that opens for a portion of a clock cycle.

7. The clock signal selection system of claim 1 wherein the plurality of clock signals span different clock domains.

8. A clock system comprising:

a clock generation system for generating a plurality of at least three clock signals;

a clock selection system for selecting between the plurality of at least three clock signals, wherein each one of the plurality of clock signals have a respective each one of a plurality of corresponding external clock selection indication signals, wherein at least two of said external clock selection indication signals are independently externally generated, and wherein the clock selection system ensures one hot selection and utilizes cross coupling feedback of clock selection indications in the selecting; and a selection input register for forwarding the clock selection indications.

9. The clock system of claim 8 wherein the clock generation system includes a plurality of clock generation components.

10. The clock system of claim 8 wherein the selection input register receives input in accordance with software controlled instructions.

11. The clock system of claim 8 the clock selection system performs the selecting while minimizing introduction of clock glitches and runt pluses.

12. The clock system of claim 8 wherein each of said plurality of at least three clock signals is selected based upon a plurality of cross coupling feedbacks.

13. The clock signal selection method comprising:

receiving a plurality of clock signals and a plurality of corresponding respective external clock selection indication signals input to an arbitration component, wherein at least two of said external clock selection indication signals are independently externally generated;

arbitrating impact of the plurality of selection indication signals to minimize conflict in enabling an active clock signal, including ensuring one hot selection; and enabling an active clock signal from one of the plurality of clock signals to be output, wherein the enabling is controlled by a clock included in the plurality of clock signals and included opening a latch for a portion of a clock cycle.

14. The clock signal selection method of claim 13 wherein the enabling and arbitrating utilizes feedback from a clock signal that is running in another previously selected clock domain.

15. The clock signal selection method of claim 13 wherein the arbitrating ensures an enablement of one of the plurality of clock signals does not occur while another of the plurality of clock signals is enabled.

16. The clock signal selection method of claim 13 wherein timing between one of the plurality of clock signals being enabled and another of the plurality of clock signals being enabled prevents a runt pulse.

17. The clock signal selection method of claim 13 wherein the enabling and arbitrating includes changing from one of the plurality of clock signals to control the enabling and arbitrating to another of the plurality of clock signals to control the enabling and arbitrating.

18. The clock signal selection method of claim 13 wherein the enabling and arbitrating are tolerant of clock skew.

19. The clock signal selection method of claim 13 wherein skew on a clock select decode signal is less than 1 cycle of the fastest clock period to reduce or avoid increase clock hole time.

20. The clock signal selection method of claim 13 wherein there are 1 to 3 target clock cycles in a clock hole.

\* \* \* \* \*